United States Patent
Shemesh et al.

(10) Patent No.: US 10,922,809 B2
(45) Date of Patent: Feb. 16, 2021

(54) METHOD FOR DETECTING VOIDS AND AN INSPECTION SYSTEM

(71) Applicants: Applied Materials, Inc., Santa Clara, CA (US); Applied Materials Israel Ltd., Rehovot (IL)

(72) Inventors: Dror Shemesh, Hod Hasharon (IL); Vadim Kuchik, Kiriat Ekron (IL); Nicolas L. Breil, Alviso, CA (US)

(73) Assignees: APPLIED MATERIALS, INC., Santa Clara, CA (US); APPLIED MATERIALS ISRAEL LTD., Rehovot (IL)

( * ) Notice: Subject to any disclaimer, the term of this patent is extended or adjusted under 35 U.S.C. 154(b) by 233 days.

(21) Appl. No.: 16/050,412

(22) Filed: Jul. 31, 2018

(65) Prior Publication Data

US 2019/0043183 A1    Feb. 7, 2019

Related U.S. Application Data

(60) Provisional application No. 62/626,847, filed on Feb. 6, 2018, provisional application No. 62/539,799, filed on Aug. 1, 2017.

(51) Int. Cl.
*G06T 7/00*     (2017.01)
*G06T 7/11*     (2017.01)
*H01J 37/22*    (2006.01)

(52) U.S. Cl.
CPC ............... *G06T 7/001* (2013.01); *G06T 7/11* (2017.01); *H01J 37/222* (2013.01); *G06T 2207/10061* (2013.01); *G06T 2207/30148* (2013.01); *H01J 2237/221* (2013.01); *H01J 2237/2804* (2013.01); *H01J 2237/2817* (2013.01)

(58) Field of Classification Search
None
See application file for complete search history.

(56) References Cited

U.S. PATENT DOCUMENTS

| | | | |
|---|---|---|---|
| 6,229,331 B1 * | 5/2001 | Kuwabara | G01R 31/311 324/762.03 |
| 2006/0049349 A1 | 3/2006 | Shemesh | |
| 2006/0232768 A1 | 10/2006 | Borden et al. | |
| 2007/0114404 A1 * | 5/2007 | Shemesh | H01J 37/28 250/310 |
| 2007/0201018 A1 * | 8/2007 | Takeda | G01N 21/95607 356/237.2 |

(Continued)

OTHER PUBLICATIONS

International Search Report and Written Opinion for International Application No. PCT/US2018/044596, dated Nov. 19, 2018, 14 pages.

(Continued)

*Primary Examiner* — Justin P. Misleh
(74) *Attorney, Agent, or Firm* — Kilpatrick Townsend & Stockton LLP (57) ABSTRACT

A method for detecting voids in a metal line of a semiconductor device die includes: scanning an electron beam upon a selected location on the die containing the metal line; determine gray levels in an image produced by collected electrons of the electron beam backscattered from the selected location on the die; and identifying one or more voids in the metal line based on differences between the gray levels in the image.

15 Claims, 11 Drawing Sheets

(56) References Cited

U.S. PATENT DOCUMENTS

| | | | |
|---|---|---|---|
| 2009/0218490 A1 | 9/2009 | Suzuki et al. | |
| 2012/0257041 A1* | 10/2012 | Nakagaki | H01J 37/28 348/80 |
| 2013/0256528 A1 | 10/2013 | Xiao et al. | |
| 2013/0336575 A1* | 12/2013 | Dalla-Torre | G06T 7/001 382/149 |
| 2015/0170875 A1 | 6/2015 | Ban et al. | |
| 2016/0189369 A1* | 6/2016 | Jung | G06T 7/001 382/149 |
| 2018/0053295 A1* | 2/2018 | Ryu | G06T 7/0004 |

OTHER PUBLICATIONS

Lei, M. et al., "Detection of Metallic Buried Void by Effective Density Contrast Mode," Proceedings of SPIE vol. 9778, 97780Q, 2016, Metrology, Inspection, and Process Control for Microlithography, downloaded from: http://proceedings.spiedigitallibrary.org/ on Aug. 1, 2017, 9 pages.

Tsigkourakos, M. et al., "Void detection in copper interconnects using energy dispersive x-ray spectroscopy," Journal of Vacuum Science & Technology B, Nanotechnology and Microelectronics: Materials, Processing, Measurement, and Phenomena 30(5), Sep./Oct. 2012, 6 pages.

Breil, N. et al., "Electron Beam Detection of Cobalt Trench Embedded Voids Enabling Improved Process Control for Middle-of-Line at the 7nm Node and beyond," International Electron Devices Meeting (IEDM), Dec. 2017, 4 pages.

Hung, R. et al., "Extreme Contact Scaling with Advanced Metallization of Cobalt," 2018 IEEE International Interconnect Technology (IITC), p. 30-32.

Tseng, J. et al., "Embedded metal voids detection to improve Copper metallization for advanced interconnect," International Interconnect Technology Conference, 2018, pp. 169-171.

* cited by examiner

METHOD FOR DETECTING VOIDS AND AN INSPECTION SYSTEM

CROSS-REFERENCES TO RELATED APPLICATIONS

This application claims the benefit of U.S. Provisional Application No. 62/539,799, filed Aug. 1, 2017, and this application claims the benefit of U.S. Provisional Application No. 62/626,847, filed Feb. 6, 2018, the contents, including appendices, of each of which are hereby incorporated herein by reference in their entireties.

BACKGROUND

Unless otherwise indicated herein, the materials described in this section are not prior art to the claims in this application and are not admitted to be prior art by inclusion in this section.

The requirements for performance and yield in the Middle-Of-Line (MOL) metallization have made the replacement of tungsten by the low resistivity cobalt a necessity at smaller semiconductor device geometries. However, the shrinking geometries in turn place elevated demands on the metallization process. One of the most common defects found in copper and cobalt conducting elements is buried voids, which is known as a major source of yield loss and reliability degradation.

The ability to detect failure modes as early as possible and non-destructively provides a critical advantage for accelerating process development learning cycles. A typical defect analysis is done using electrical measurements coupled with and extensive use of Transmission Electron Microscope (TEM) analysis. TEM analysis is a lengthy, expensive, and destructive process. Further, a typical defect analysis takes weeks from processing to electrical testing.

SUMMARY

Apparatuses and methods for detecting voids in metal lines are provided.

According to various aspects there is provided a method for detection of voids in a semiconductor device during fabrication. In some aspects, the method may include: selecting or receiving a selection of locations within a semiconductor device die for void detection; with an electron beam imaging system, collecting electrons emanating from the semiconductor device die in response to impinging a high energy primary particle beam onto an area of the semiconductor device die and creating a corresponding void image where the voids are to be found; determining if differences in gray level values exist in one or more of the selected locations to thereby identify the presence of voids in the selected locations.

Some embodiments may also include providing a reference image and comparing the reference image with the void image to identify the voids in the defect image. The differences in gray level values may be determined by comparing the void image with the reference image that is substantially free of voids. The number of voids detected per location may be counted to create a wafer map of metal voids. The voids may be metal voids, and creating the void image may include segmenting an image of the selected locations into metal lines and dielectric spaces.

The differences in gray level values may be determined by analyzing gray level values in segments of the void image corresponding to the metal lines. The energy of a primary particle beam may be determined in response to void material, void depth, void size, and/or feature information.

According to various aspects there is provided electron beam imaging system. The electron beam imaging system may carry out the method.

According to various aspects there is provided a computer program. In some aspects, the computer program may include code portions for performing the method.

According to various aspects there is provided a method for detecting voids in a metal line of a semiconductor device die. In some aspects, the method may include: scanning an electron beam upon a selected location on the die containing a metal line; determining gray levels in an image produced by collected electrons of the electron beam backscattered from the selected location on the die; comparing the gray levels in the image to gray levels in a reference image; and determining one or more voids in the metal line based on differences between the gray levels in the image and the gray levels in the reference image.

The reference image may be an image of a metal line of a semiconductor device die substantially free of voids. The depth of the voids detected may vary with the energy of the electron beam impinging on the selected location on the die.

The method may further include performing a plurality of scans with the electron beam upon the selected location on the die using a different electron beam energy (e.g., landing energy) for each scan; and determining one or more voids in the metal line at different depths of the metal line based on the electron beam energy for each scan and differences between the gray levels in the image and the gray levels in the reference image. An electron beam having a first energy may be used to detect a first void in the metal line close to a surface of the metal line and an electron beam having a second energy greater than the first energy may be used to detect a second void in the metal line deeper than the first void.

According to various aspects there is provided an apparatus for detecting voids in a metal line of a semiconductor device die. In some aspects, the apparatus may include: an electron source configured to generate a charged particle beam directed to a selected location on the die containing a metal line; a backscattered electron (BSE) detector configured to detect electrons backscattered from the die, and a processor.

The processor may be configured to: receive one or more signals from the BSE detector; process the one or more signals to generate a void image of the metal line; compare the void image to a substantially void-free reference image; and determine whether voids exist in the metal line based on a comparison of the void image and the reference image.

The processor may be configured to compare a gray level signature of the void image to a gray level signature of the reference image. The processor may also be configured to control the electron source to perform a plurality of scans with the electron beam upon the selected location on the die using a different electron beam energy for each scan. The processor is configured to determine a depth of the detected voids in the metal line based at least in part on an energy of the electron beam impinging on the selected location on the die.

The processor may be configured to control the electron source to generate a first electron beam having a first energy and a second electron beam having a second energy greater than the first energy, and detect a first void in the metal line close to a surface of the metal line using the first electron beam and detect a second void in the metal line deeper than the first void using the second electron beam. The processor may also be configured to determine a number of voids detected at each selected location on each die on a wafer, and create a wafer map of metal voids.

Numerous benefits are achieved by way of the various embodiments over conventional techniques. For example, the various embodiments provide apparatuses and methods that can be used to circumvent lengthy, destructive defect analysis process. In some embodiments, defect analysis may be nondestructively performed with an improved Scanning Electron Microscope (SEM) imaging technique. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Apparatuses and methods for detecting voids in metal lines are provided. In accordance with various aspects of the present disclosure, feedback on process quality may be obtained in a matter of hours and is a non-destructive process. An improved scanning electron microscope (SEM) imaging technique may enable accurate non-destructive detection of voids embedded inside MOL metal trenches.

Cobalt (Co) metal fill of trench structures of a semiconductor device may start with a metal organic atomic layer deposition (MO-ALD) of a titanium nitride (TiN) liner having a thickness of a few nanometers. The Co deposition that follows may be performed using a combination of physical vapor deposition (PVD), chemical vapor deposition (CVD), and a plasma enhanced (PE) CVD. A Co reflow annealing may also be used in order to more perfectly fill the trenches. The key parameters involved to achieve a void-free gap fill are the control of the interface between the underlying TiN and the Co, as well as the parameters of the CVD and anneal processes.

Figure 1A:
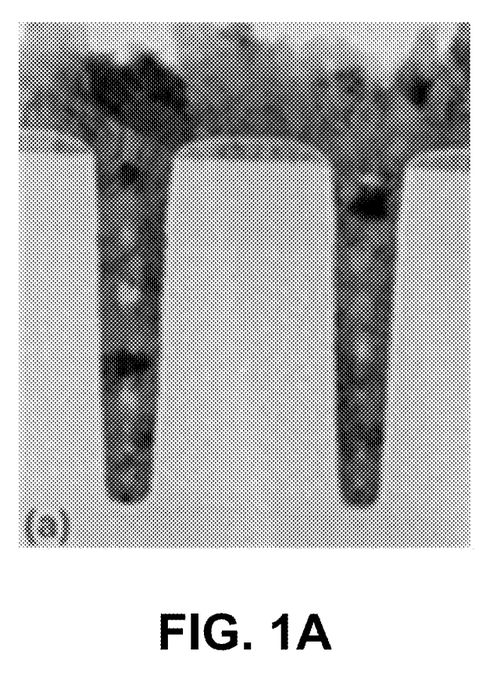
FIG. 1A is a cross-section TEM image of trench structures filled with as-deposited CVD Co film according to various aspects of the present disclosure.
Figure 1B:
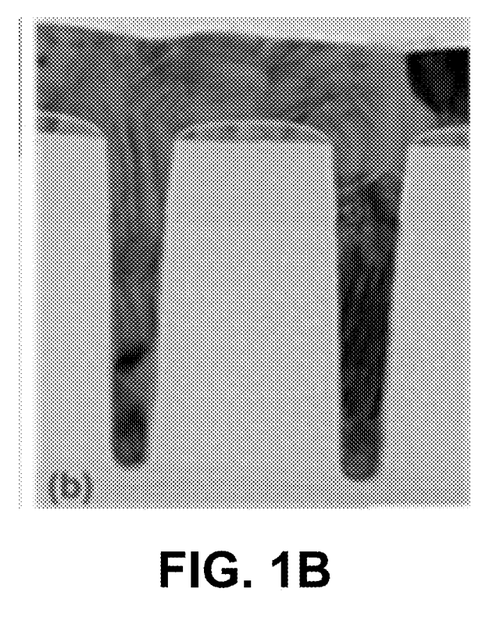
FIG. 1B is a cross-section TEM image of the trench structures filled after annealing the CVD Co film according to various aspects of the present disclosure.

FIG. 1A is a cross-section TEM image of trench structures filled with as-deposited CVD Co film according to various aspects of the present disclosure. FIG. 1B is a cross-section TEM image of the trench structures filled after annealing the CVD Co film according to various aspects of the present disclosure. As illustrated in FIGS. 1A and 1B, the above process may produce a film of Co with large grains, no seams, and ideally no voids.

Figure 2:
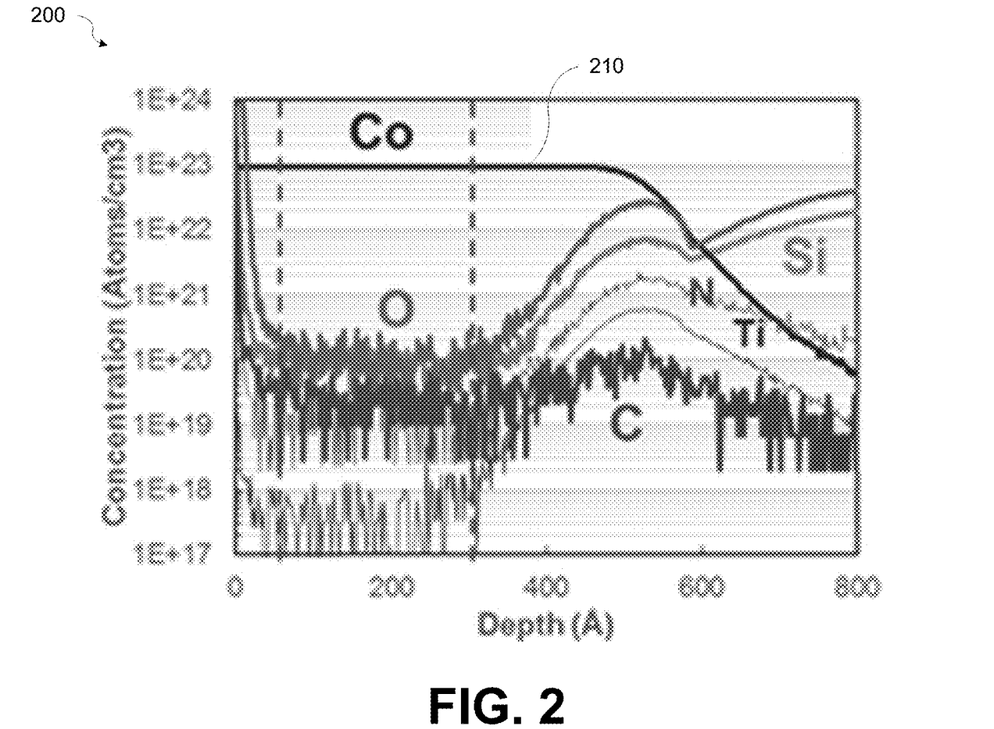
FIG. 2 is a secondary-ion mass spectrometry (SIMS) plot of the Co film illustrated in FIGS. 1A and 1B according to various aspects of the present disclosure.

FIG. 2 is a secondary-ion mass spectrometry (SIMS) plot 200 of the Co film illustrated in FIGS. 1A and 1B. As can be seen in FIG. 2 by the high Co concentration curve 210, the above process may produce a nearly pure film of Co.

In accordance with various aspects of the present disclosure, an electron beam (e-beam) detection technique for detecting voids in metal lines is provided. To detect voids in a Co film, the e-beam should be able to penetrate deep enough in the Co-filled trenches. The e-beam interaction range, R, i.e., the depth to which the e-beam may penetrate, can be described by equation (1):

$$R = k\frac{E^{1.5}}{\rho} \quad (1)$$

where $\rho$ is the material density and E is the e-beam energy.

Figure 3:
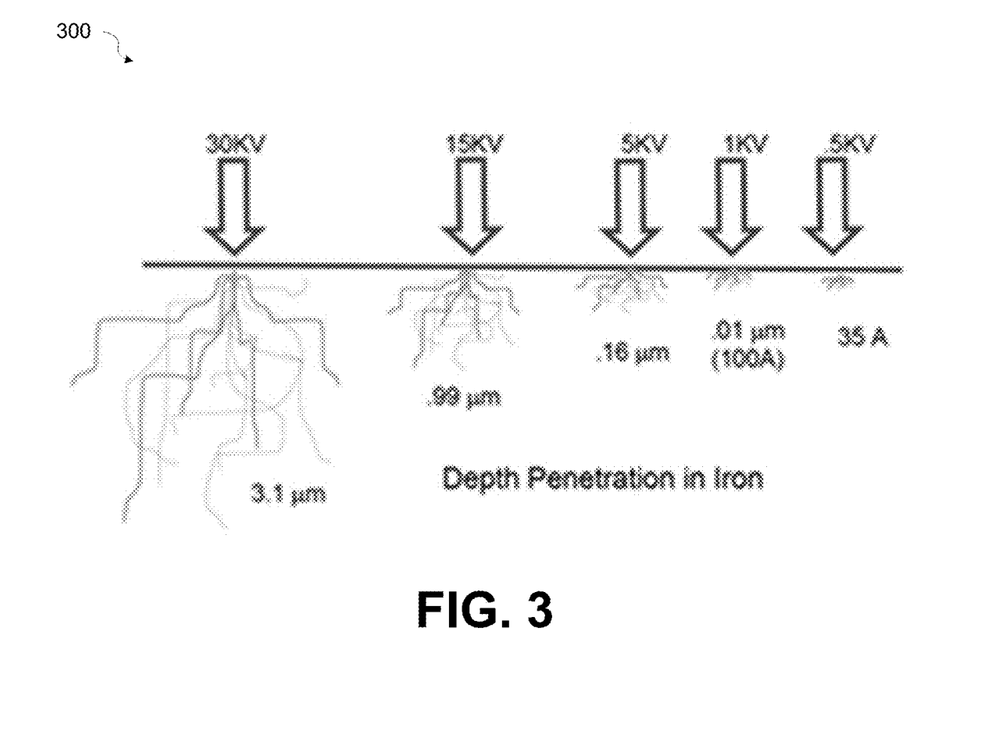
FIG. 3 is a diagram illustrating the interaction range between an electron beam and a metal target according to various aspects of the present disclosure.

FIG. 3 is a diagram 300 illustrating the interaction range between an electron beam with energies ranging from 0.5 to 30 kV and a metal target. In FIG. 3, a well characterized iron material is used as a proxy to Co due to the chemical similarities of both elements. As can be seen in FIG. 3, the interaction depth between the e-beam and the metal target ranges from 35 Angstroms to 3.1 µm depending on the e-beam energy.

Figure 4:
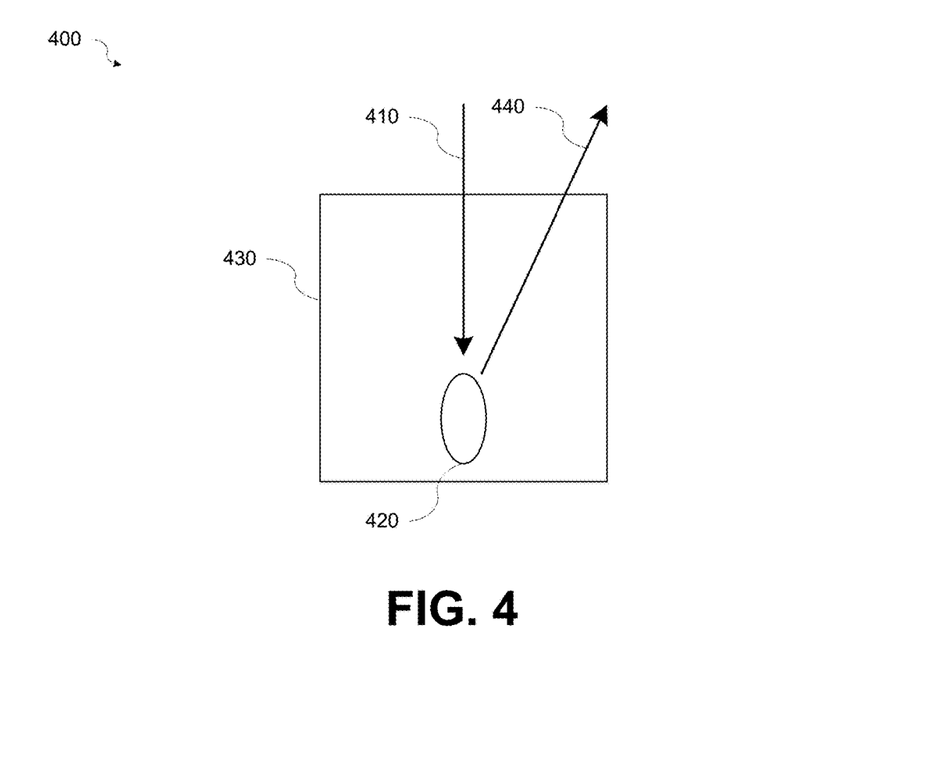
FIG. 4 is a diagram illustrating an example of 2-way e-beam paths according to various aspects of the present disclosure.

To detect information on the phenomenon happening below the surface of the metal, the e-beam should be scattered through the bulk material. FIG. 4 is a diagram 400 illustrating an example of two-way e-beam paths according to aspects of the present disclosure. The mean free path of an electron increases with energy. Referring to FIG. 4, a high energy e-beam 410 may be used to generate signal from voids 420 in the metal 430 such that high energy scattered electrons 440 have the energy to travel to the detection system.

Since voids in Co are usually smaller than the Co line width, detection of voids as small as 5 nm may be beneficial. A spot size smaller than 3 nm may be needed to detect sub-10 nm voids in the metal. Scattered electrons detected with a backscattered electron (BSE) detector indicate that a maximum information depth of the emitted electrons is between about 60 nm to 100 nm. Although the interaction depth between the e-beam and the metal is higher, fewer electrons are generated deeper than 100 nm, and the spot size may be too big to detect small voids.

Figure 5A:
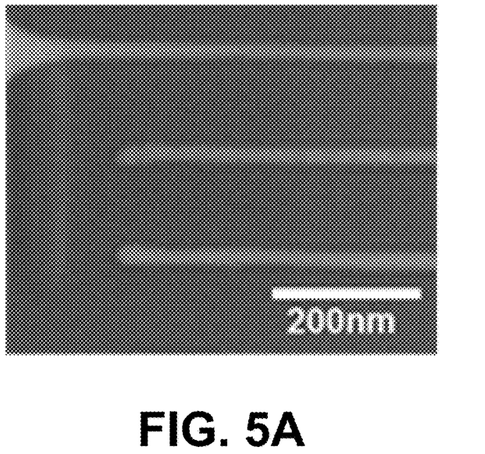
FIG. 5A is a BSE image of a test wafer having Co trench line widths between 13 and 40 nm produced using a conventional void detection technique.
Figure 5B:
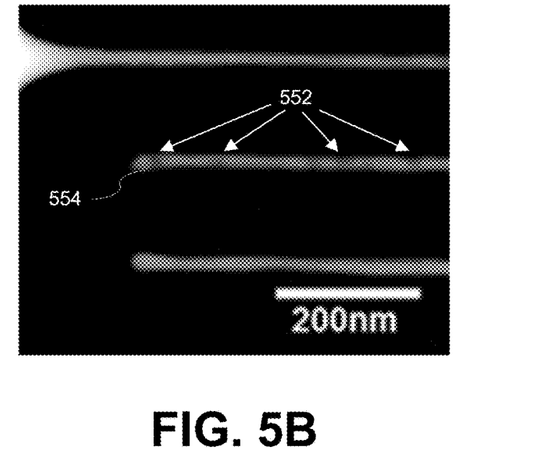
FIG. 5B is a BSE image of a test wafer having CO trench line widths between 13 and 40 nm produced using a void detection technique according to various aspects of the present disclosure

FIG. 5A is a BSE image of a test wafer having Co trench line widths between 13 nm and 40 nm produced using a conventional void detection technique. FIG. 5B is a BSE image (or void image) of a test wafer having Co trench line widths between 13 nm and 40 nm produced using a void detection technique according to various aspects of the present disclosure. As can be seen in FIG. 5B, the BSE image produced by the improved detection technique according to the present disclosure clearly shows dark spots 552 indicating embedded voids along the thin Co line 554. Verification of the void detection was performed by cross-sectioning the Co trench line shown in FIG. 5B.

Figure 6A:
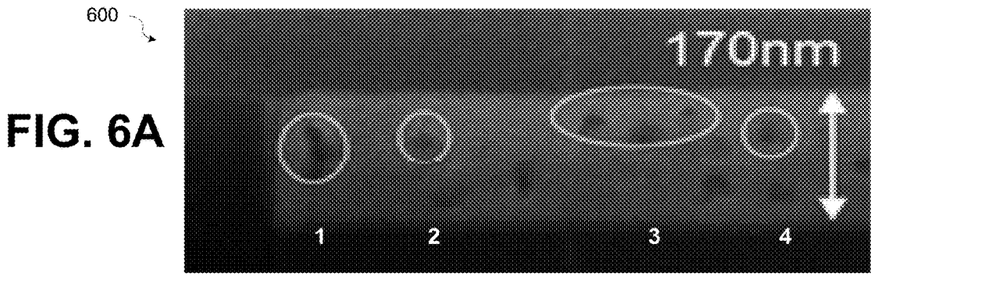
FIG. 6A is a cross-section of the Co trench line shown in FIG. 5B showing the detected voids according to various aspects of the present disclosure.
Figures 6B, 6C:
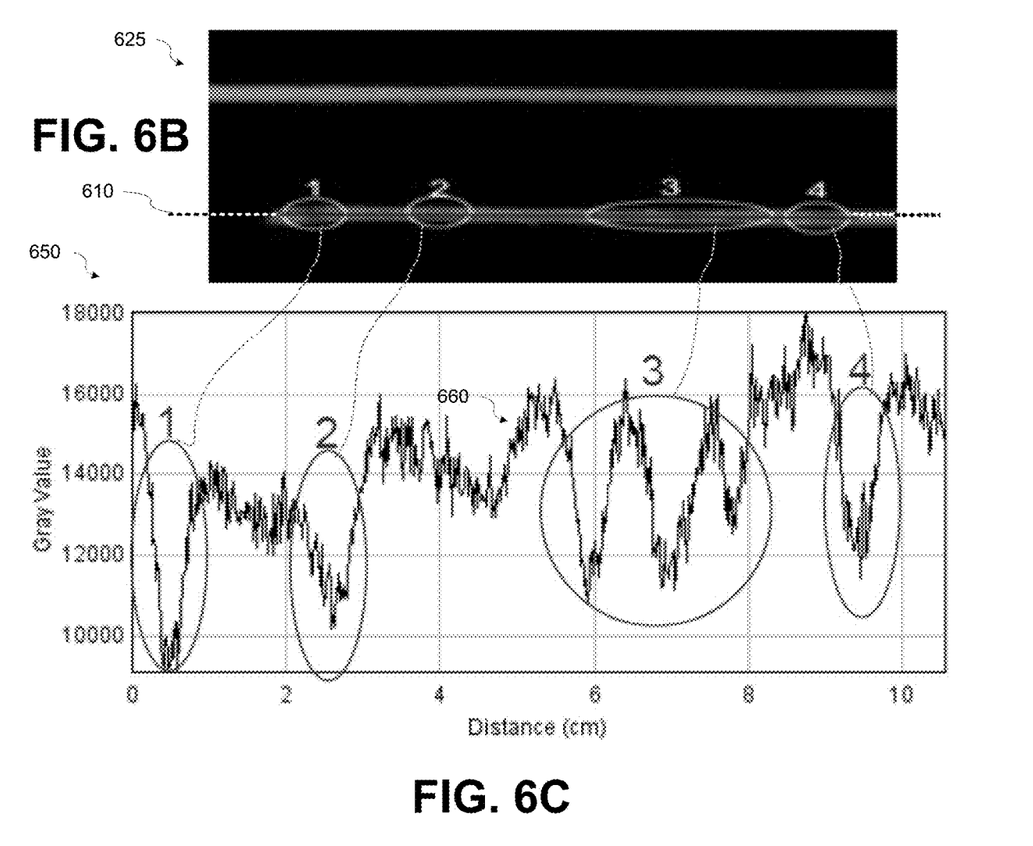
FIG. 6B is a top-down BSE image of the Co trench line shown in FIG. 5B highlighting the detected voids according to various aspects of the present disclosure.
FIG. 6C is a plot illustrating a gray level signature of the detected voids of the Co trench line shown in FIG. 5B according to various aspects of the present disclosure.

FIG. 6A is a cross-section 600 of the Co trench line shown in FIG. 5B showing the detected voids according to various aspects of the present disclosure. FIG. 6B is a top-down BSE image 625 of the Co trench line shown in FIG. 5B highlighting the detected voids (1, 2, 3, 4) according to various aspects of the present disclosure. FIG. 6C is a plot 650 illustrating a gray level signature 660 of the detected voids of the Co trench line shown in FIG. 5B according to various aspects of the present disclosure. FIGS. 6A-6C show the correlation between the gray level variations (FIG. 6C) on the top-down void image (FIG. 6B), and the voids found in the cross-section image (FIG. 6A). The dark spots (1, 2, 3, 4) on the cross-section image 600 indicate voids. The gray levels (1, 2, 3, 4) shown in FIG. 6C are correlated with the voids found in the cross-section image 600 of FIG. 6A. As illustrated in FIG. 6C, the contrast measurement (i.e., gray level) is a function of void depth and size. Voids down to 70 nm deep may be detected.

In accordance with various aspects of the present disclosure, the detection method may use gray level signatures or other signatures to identify voids. The detection method may search for a signature of a void within an acquired image. The signatures may be provided to the inspection system by an external source or may be generated by the inspection system. It may be assumed that voids differ from each other and that a comparison between gray levels of one conductor (or one area of an inspected article) to gray levels of nearly identical other conductor (or another area of another inspected article) may be used to detect the voids. Comparison methods such as cell to cell comparison, die to die comparison, computer aided design (CAD) based comparisons, golden image based comparison, or other comparison may be used. In the context of cell to cell comparison, the cells may be different parts of the same conductor, different parts of different conductors, etc.

Figure 7A:
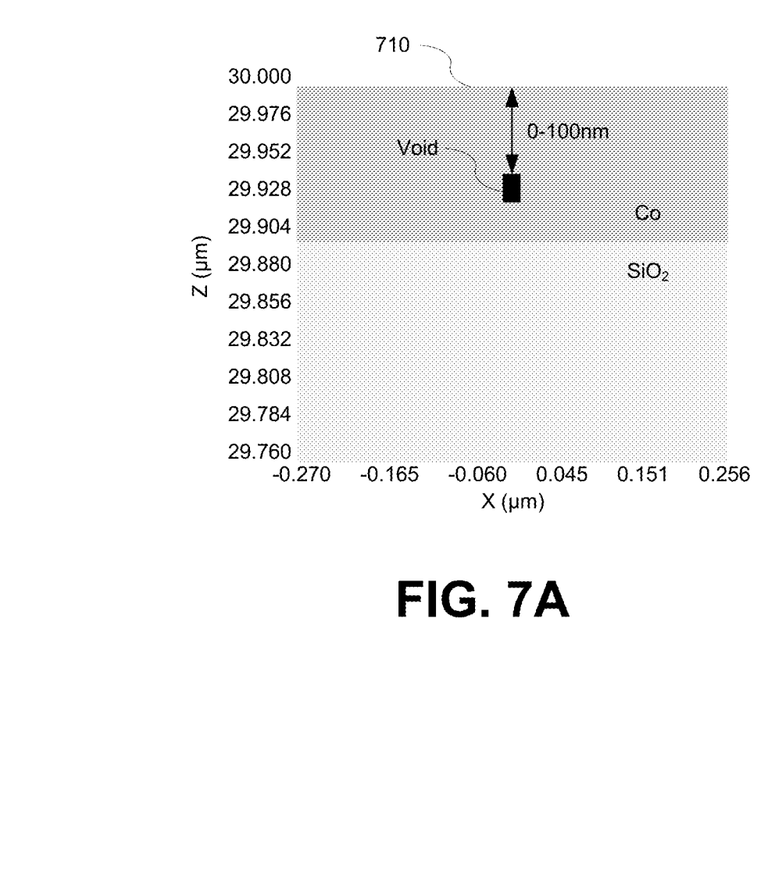
FIGS. 7A and 7B are diagrams illustrating a simulation model developed to validate experimental results according to various aspects of the present disclosure.
Figure 7B:
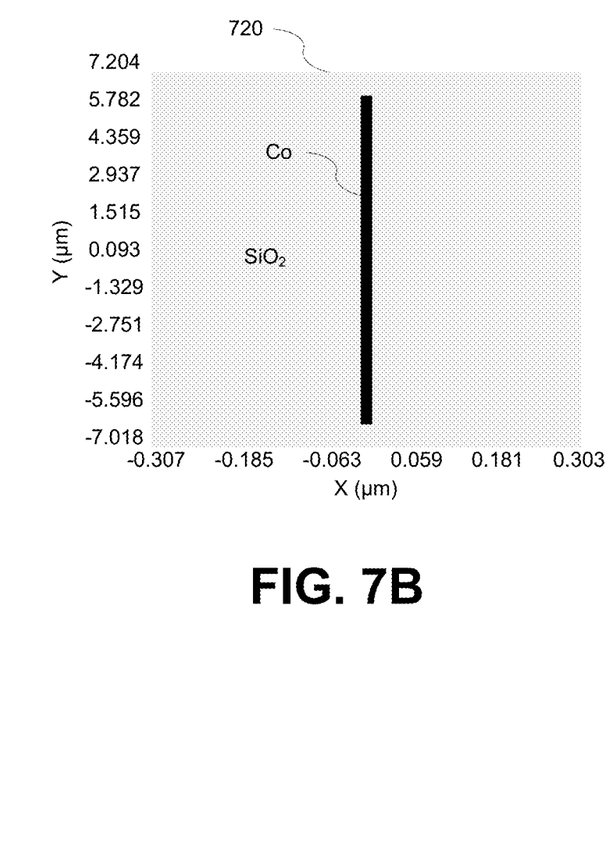

FIGS. 7A and 7B are diagrams illustrating a simulation model 700 developed to validate experimental results according to various aspects of the present disclosure. FIG. 7A illustrates a cross-section 710 of the model 700 while FIG. 7B illustrates a top-down view 720 of the model. For various simulation conditions of voids having different volumes and buried under different Co thicknesses, contrast was calculated for scattered signals at energies of 10, 15, 20, 25, and 30 kV according to equation 2:

$$\text{Contrast} = \frac{\text{Signal} - \text{Background}}{\text{Signal} + \text{Background}} \quad (2)$$

where Signal indicates a number of electrons generated from a location of a void and Background indicates a number of electrons generated when no voids exist.

Figure 8:
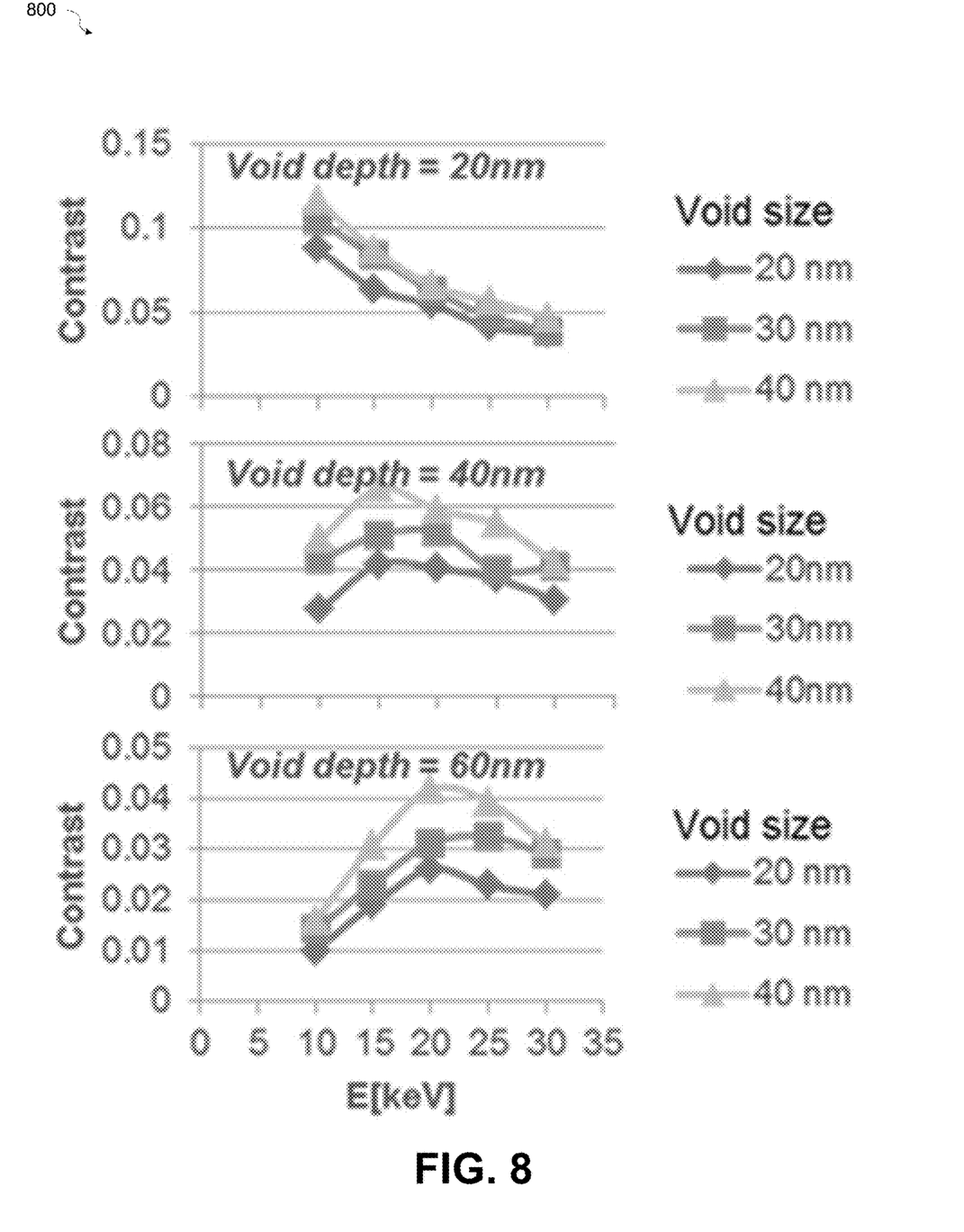
FIG. 8 is a series of plots 800 illustrating simulation results of void contrast calculations as a function of beam energy and void size according to various aspects of the present disclosure.

FIG. 8 is a series of plots 800 illustrating simulation results of void contrast calculations as a function of beam energy and void size according to various aspects of the present disclosure. As illustrated in FIG. 8, beam energy that yields maximum void contrast depends on how deep the void is buried. When the void is close to the surface (e.g., buried under 20 nm of cobalt), a relatively small energy may produce the maximum contrast. However, when the void is deeper, a higher energy may be required. For example, referring to FIG. 8, an energy of 20 kV may be required to generate the maximum contrast and detect voids buried 60 nm below the surface. Energy needed to generate the maximum contrast may have a weaker dependency of the size of voids. The beam energy may be adapted to maximize detection of voids, i.e., deeper voids may be detected with higher energies, while shallower voids favor lower energies. Void detection may involve scanning the same conductor multiple times using different amounts of energy.

Figure 9:
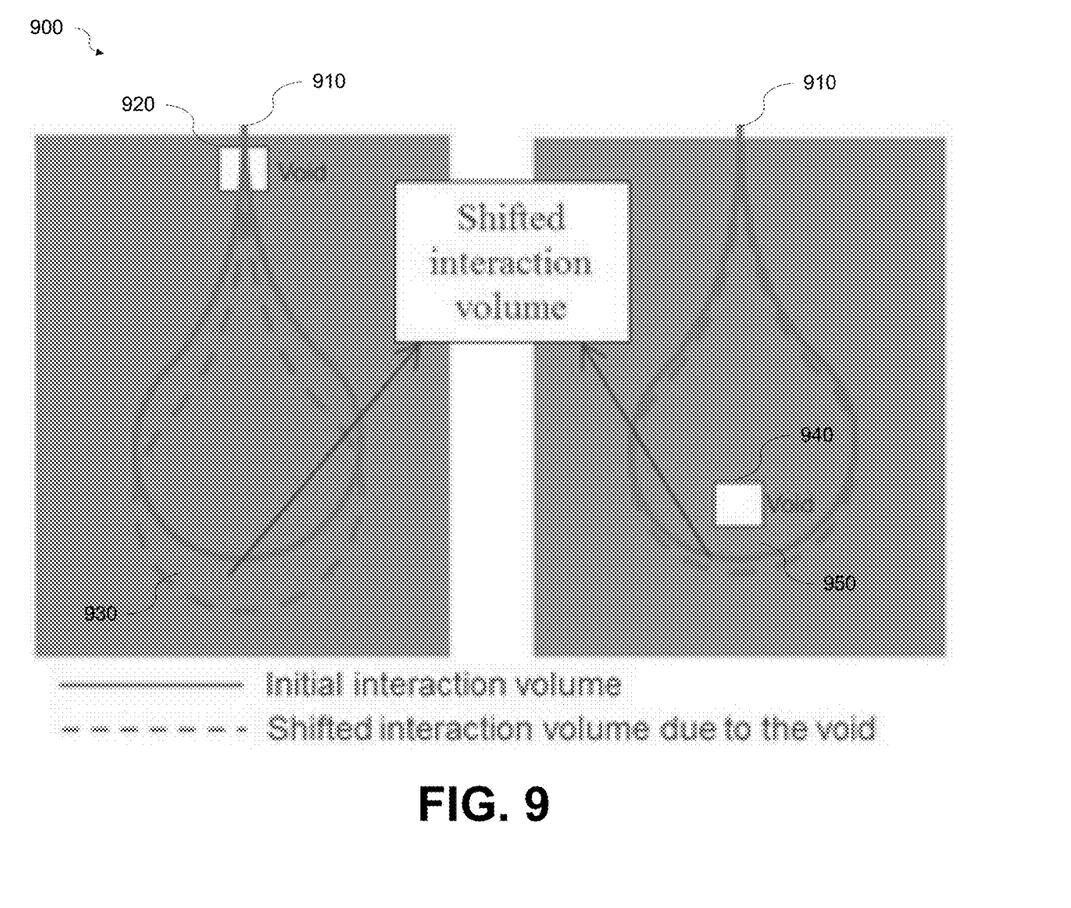
FIG. 9 is a diagram illustrating the influence of void depth on interaction volume according to various aspects of the present disclosure.

Voids located closer to the surface may produce a higher contrast compared to voids buried deeper under the surface, which may make those voids easier to detect. FIG. 9 is a diagram 900 illustrating the influence of void depth on interaction volume according to various aspects of the present disclosure. Referring to FIG. 9, while the e-beam 910 is well concentrated when it is close to the surface, the existence of a void 920 close to the surface may shift the interaction volume 930 down. On the other hand, a deeper void 940 may have a smaller influence on the interaction volume 950 as the void size can be relatively small compared to the overall interaction volume 950. The shift in the interaction volume may be smaller for deeper voids making the contrast lower and more challenging to detect.

Inspection and metrology equipment configured with a BSE detector for metal void measurements having high resolution and capable of advanced imaging techniques, such as see through, high aspect ratio, topography and electron detection may be used for void detection. When combined with high precision measurements and extensive sampling capability, they may reveal hidden process signatures within dice and across entire wafers.

Figure 10:
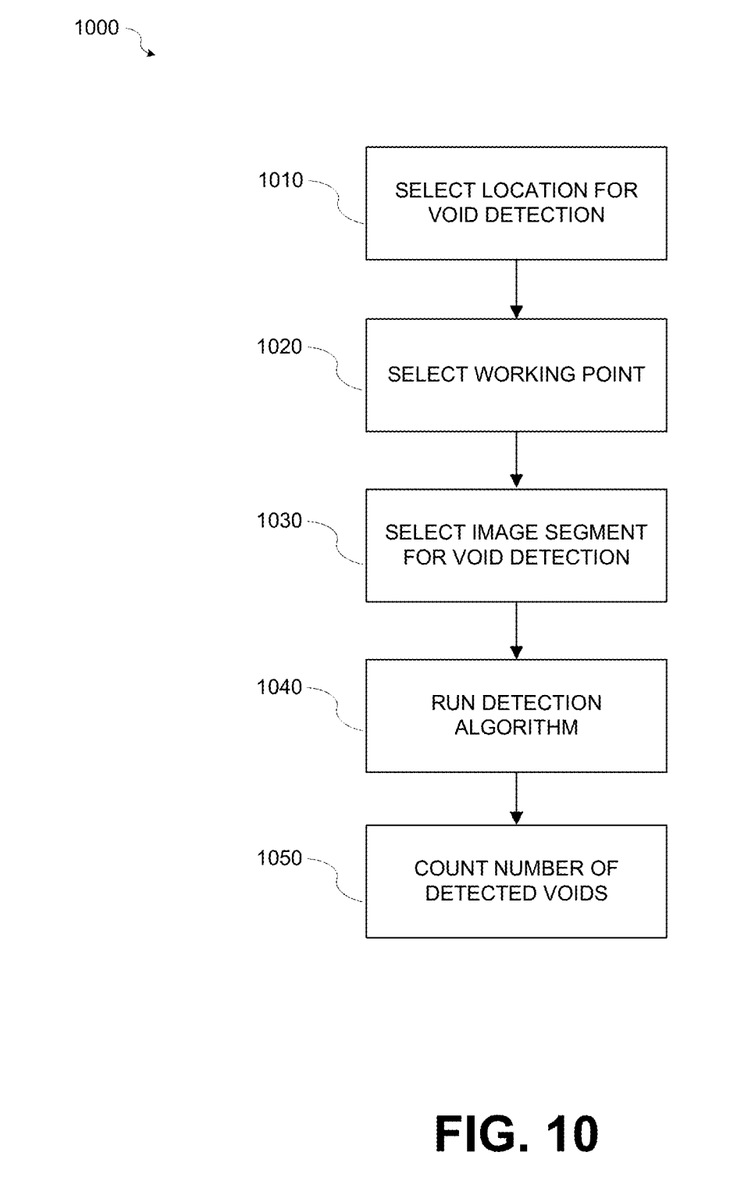
FIG. 10 is a flowchart of a method for detecting voids according to various aspects of the present disclosure.

In accordance with various aspects of the present disclosure, an algorithm for detection of voids may use parallel computing and advanced data processing. FIG. 10 is a flowchart of a method 1000 for detecting voids in a semiconductor device die according to various aspects of the present disclosure. Referring to FIG. 10, at block 1010, a location for void detection within the semiconductor device die may be selected. The selection may be done in any manner, for example, based on previously located voids, based on critical parts of the integrated circuit, based on failure analysis, etc. At block 1020, a working point of an electron beam imaging system may be selected. A working point that uses high energy and collects electrons emanating from the semiconductor device die, for example an e-beam energy in a range of 0.5 to 30 kV may be selected.

Referring again FIG. 10, at block 1030, an image segment of the semiconductor device die where voids may be found is selected. For example, a metal line portion of the image may be segmented out from a dielectric space portion of an image and only the metal line portion of the image used for void detection. At block 1040, a detection algorithm may be used to find the metal voids. For example, the detection algorithm may perform a gray scale analysis, and differences in the gray level values may be identified in one or more locations to identify the presence of voids.

Figure 11:
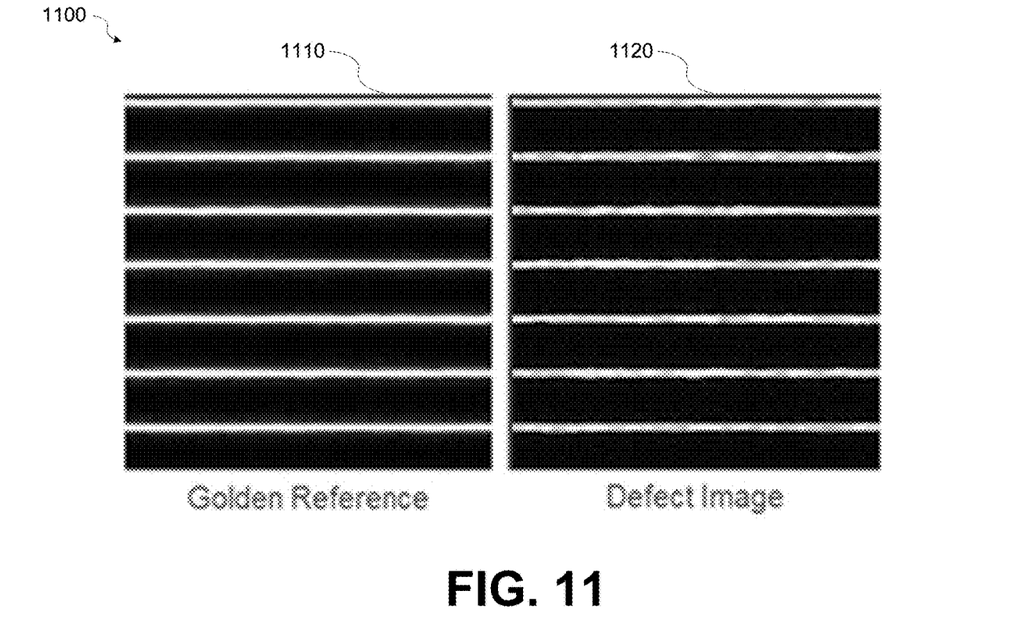
FIG. 11 is an image illustrating a golden reference and a defect image according to various aspects of the present disclosure.

In some embodiments, a reference image may be obtained. The reference image may be, for example, but is not limited to, a "golden" image, an image of an ideally identical or substantially similar cell or die, a CAD based image, etc. The reference image may be created or obtained from another source. For example, FIG. 11 is an image 1100 illustrating a golden reference 1110 and a defect image 1120 according to various aspects of the present disclosure. Referring to FIG. 11, the reference image 1110 may be created, for example, using either average gray level of multiple defect-free images or by using median gray level of multiple defect-free images. In the defect image 1120, voids appear dark in bright metal lines. The detection algorithm may compare the reference image to the void image to identify the voids.

Figure 12:
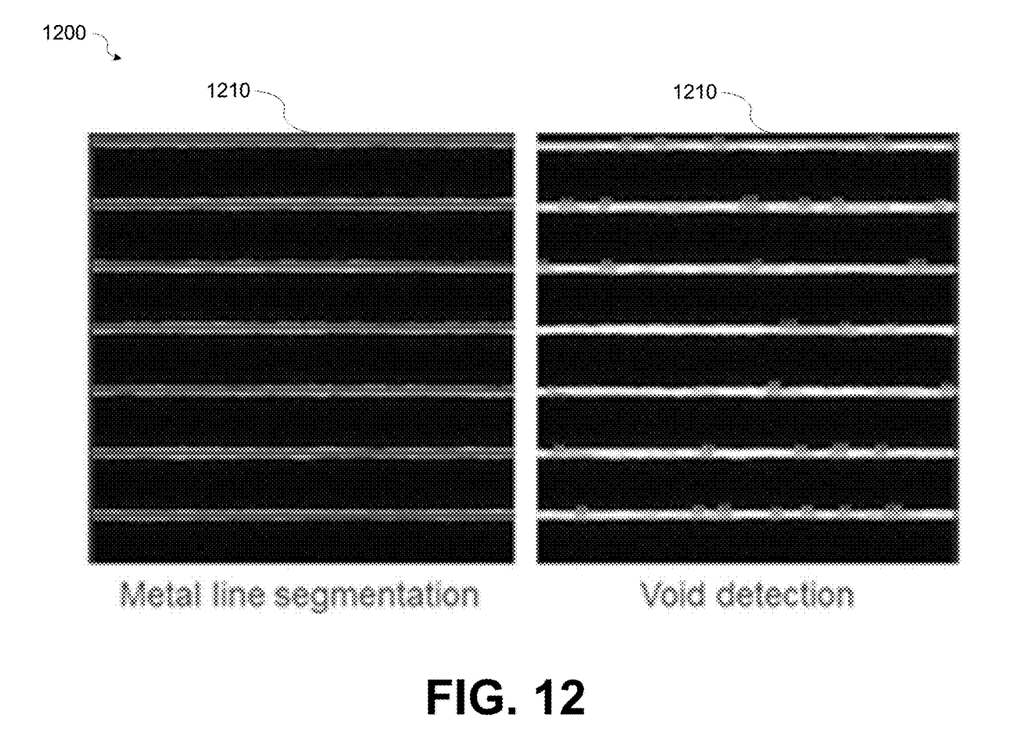
FIG. 12 is an image illustrating segmentation of metal lines for void detection and voids in the metal lines detected by a void detection algorithm according to various aspects of the present disclosure.

FIG. 12 is an image 1200 illustrating segmentation of metal lines 1210 for void detection and voids in the metal lines 1220 detected by a void detection algorithm according to various aspects of the present disclosure. Referring to FIG. 12, the metal line segmentation 1210 is shown in the left-hand panel and voids in the metal line segments 1220 detected with the void detection algorithm are shown in the right-hand panel.

Figure 13:
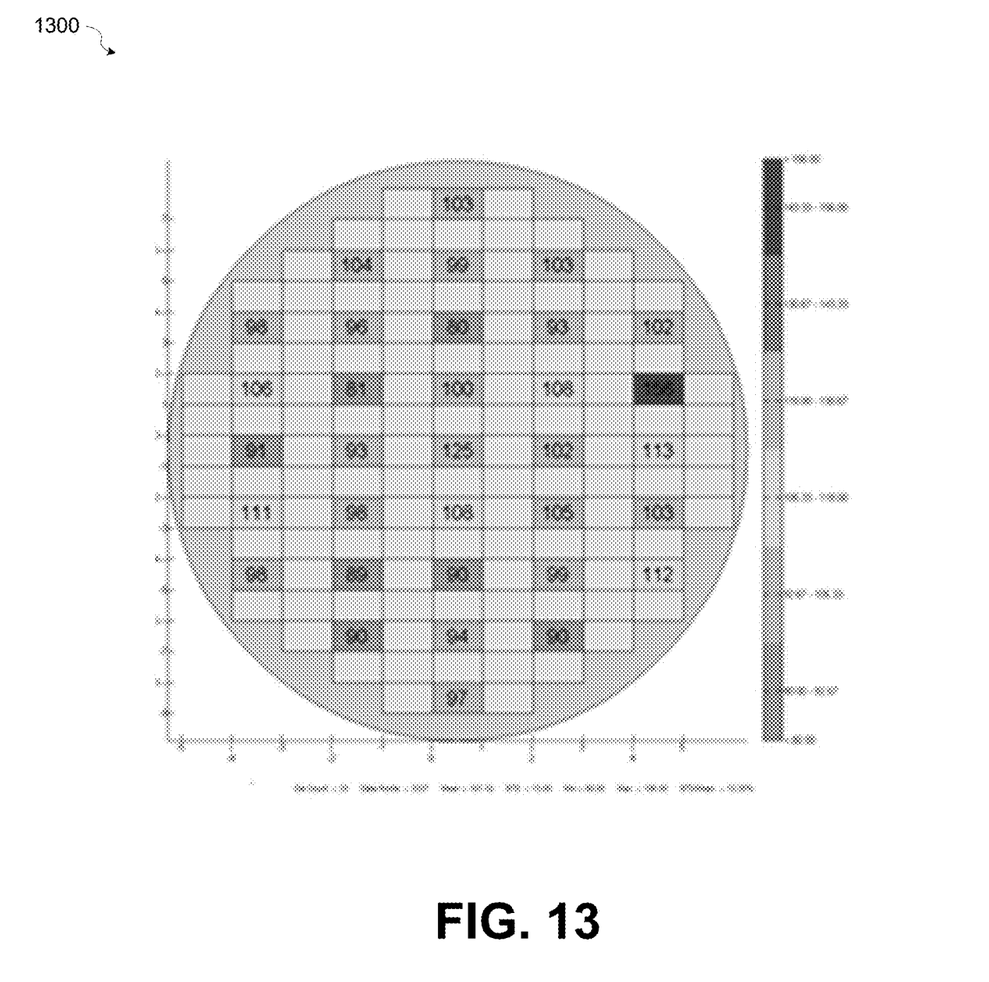
FIG. 13 is a diagram illustrating an example of die-based a defect map according to various aspects of the present disclosure.

Retuning to FIG. 10, at block 1050, the number of detected voids per location may be counted. A wafer map of metal void defects may be constructed. FIG. 13 is a diagram illustrating an example of a die-based defect map 1300 according to various aspects of the present disclosure. In FIG. 13, darker shading on the defect map 1300 indicates a higher number of defects (i.e., voids in the metal line segments of the die).

The method 1000 may be embodied on a non-transitory computer readable medium, for example, but not limited to, a memory or other non-transitory computer readable medium known to those of skill in the art, having stored therein a program including computer executable instructions for making a processor, computer, or other programmable device execute the operations of the methods.

Figure 14:
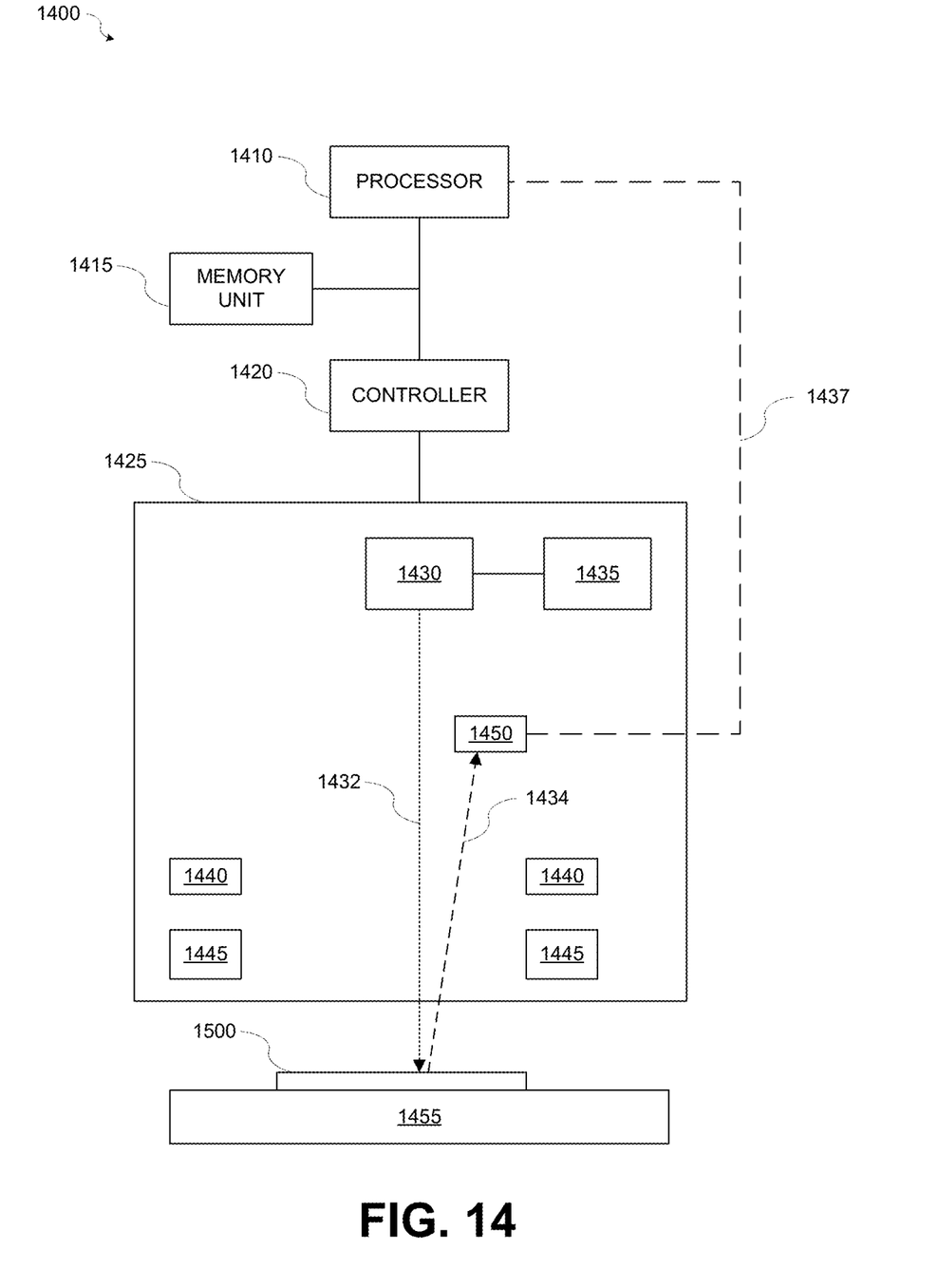
FIG. 14 is a block diagram illustrating charged particle beam system according to various aspects of the present disclosure.

FIG. 14 is a block diagram illustrating a charged particle beam system 1400 according to various aspects of the present disclosure. Referring to FIG. 14, the charged particle beam system 1400 may include a processor 1410, a memory unit 1415, a controller 1420, an image acquisition module 1425, and a mechanical stage 1455. The mechanical stage 1455 may be configured to move an object 1500 in relation to the image acquisition module 1425.

The image acquisition module 1425 may include an electron source 1430, a supply unit 1435 for feeding the electron source 1430, one or more electron optic components, for example, but not limited to, one or more lenses 1440, 1445, and a backscattered electron (BSE) detector 1450. The one or more lenses 1440, 1445 may be deflecting and/or focusing lenses, objective lenses or any other type of lenses. The one or more lenses 1440, 1445 may be magnetic lenses, electrostatic lenses or a combination of both electrical and magnetic lenses.

FIG. 14 shows a charged particle beam 1432 that is not deflected before reaching one or more lenses 1440, 1445. It is noted that the charged particle beam 1432 may be deflected any number of times before impinging on the object 1500. Backscattered electrons 1434 may be detected by the BSE detector 1450. Detection signals 1437 generated by the BSE detector 1450 may be sent, directly or indirectly, to the processor 1410 in order to be processed and detect voids in interconnects. One of ordinary skill in the art will appreciate that the image acquisition module 1425 may include more than a one BSE detector, one or more additional detectors, one or more secondary electron detectors, etc.

The detection of voids may involve using image processing, for example, but not limited to, identifying a conductive line and identifying gray-level fluctuations along the line. The detection of voids may also include generating information about the voids, for example, but not limited to, detecting the presence of the voids, the locations of the voids, the distribution of the voids, the number of voids, etc.

While examples have been provided describing the detection of voids in Cobalt—these are merely exemplary and one of ordinary skill in the art will appreciate that the above-described solutions may be used for finding voids in other materials, for example, but not limited to, copper.

The various embodiments may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process may include an executing (running) program or portion of a program, current program values and state information, and the resources used by the operating system to manage the execution of the process. An operating system (OS) is the software that manages the sharing of the resources of a computer and provides programmers with an interface used to access those resources. An operating system may process system data and user input, and respond by allocating and managing tasks and internal system resources as a service to users and programs of the system.

The computer system may include, for example, but not limited to, at least one processing unit, associated memory and a number of input/output (I/O) devices. When executing the computer program, the computer system may process information according to the computer program and produce resultant output information via I/O devices.

In the foregoing disclosure, various embodiments have been described with reference to specific examples. It will, however, be evident that various modifications and changes may be made therein without departing from the broader spirit and scope of the disclosure as set forth in the appended claims. Additionally, further details of the various embodiments are set forth in the appendices to the provisional applications, the contents of which have been incorporated herein by reference.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the various embodiments described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") may be used herein when referring to the rendering of a signal, status bit, or similar apparatus into its logically true or logically false state, respectively. If the logically true state is a logic level one, the logically false state is a logic level zero. If the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, and other embedded systems, commonly denoted in this application as "computer systems."

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

One of ordinary skill in the art will appreciate that while embodiments described in the present disclosure referred to the detection of voids in cobalt, the disclosed apparatuses and methods may be extended to use for finding voids in other materials, for example, but not limited to, copper or other materials, without departing from the scope of protection of the present disclosure.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method for detecting buried voids in metal lines of a semiconductor device substrate during fabrication, the method comprising:
    selecting locations within the semiconductor device substrate;
    with an electron beam imaging system, collecting electrons scattered from the semiconductor device substrate in response to impinging a high energy primary particle beam onto areas of the semiconductor device substrate that include the selected locations within the semiconductor device substrate;
    generating a backscattered electron image, from the collected electrons, of the areas of the semiconductor device substrate;
    segmenting the backscattered electron image into portions corresponding to the metal lines of the semiconductor device substrate and portions corresponding to areas outside the metal lines of the semiconductor device substrate, wherein each of the portions corresponding to the metal lines corresponds to one of the metal lines; and
    identifying a gray level signature for each portion and using the gray level signature to identify the buried voids within each corresponding portion, wherein fluctuations in gray levels within the gray level signature for each portion are correlated with the buried voids within each corresponding portion.

2. The method according to claim 1, wherein segmenting the backscattered electron image comprises segmenting the backscattered electron image into first portions corresponding to the metal lines of the semiconductor device substrate and second portions corresponding to dielectric spaces of the semiconductor device substrate.

3. The method according to claim 1, further comprising:
    counting a number of the buried voids identified per corresponding portion to create a wafer map of the buried voids.

4. The method according to claim 1, further comprising:
    determining an energy of the high energy primary particle beam based on at least one of the following: void material, void depth, void size, feature information.

5. An electron beam imaging system adapted to carry out the method according to claim 1.

6. A non-transitory computer readable medium comprising computer program code for running on a computer system, the computer program code including instructions for performing steps of the method according to claim 1.

7. A method for detecting buried voids in a metal line of a semiconductor device die, the method comprising:
    scanning a high energy electron beam upon a selected location on the semiconductor device die containing the metal line;
    collecting electrons of the high energy electron beam backscattered from the metal line to generate a backscattered electron image;
    identifying a gray level signature for a portion of the backscattered electron image corresponding to the metal line, the backscattered electron image produced by collected electrons of the high energy electron beam backscattered from the metal line; and
    detecting the buried voids in the metal line based on the gray level signature for the portion of the backscattered electron image corresponding to the metal line, wherein fluctuations in gray levels within the gray level signature are correlated with the buried voids.

8. The method of claim 7, further comprising estimating a depth of the buried voids based on an energy of the high energy electron beam impinging on the selected location on the semiconductor device die.

9. The method of claim 7, further comprising:
    performing a plurality of scans with the high energy electron beam upon the selected location on the semiconductor device die using a different electron beam energy for each scan;
    generating a backscattered electron image for each scan; and
    identifying a depth of the buried voids based on an energy of the high energy electron beam for each scan and differences between a gray level signature for each scan.

10. The method of claim 9, wherein an electron beam having a first energy is used to detect a first buried void in the metal line close to a surface of the metal line and an electron beam having a second energy greater than the first energy is used to detect a second buried void in the metal line deeper than the first buried void.

11. An apparatus for detecting buried voids in a metal line of a semiconductor device die, the apparatus comprising:
    an electron source configured to generate a high energy charged particle beam directed to a selected location on the semiconductor device die containing the metal line;
    a backscattered electron (BSE) detector configured to detect electrons of the high energy charged particle beam backscattered from the semiconductor device die; and
    a processor configured to:
        receive one or more signals from the BSE detector;
        process the one or more signals to generate a backscattered electron image of the metal line; and
        determine whether buried voids exist in the metal line based on a gray level signature for the backscattered electron image of the metal line, wherein fluctuations in gray levels within the gray level signature are correlated with the buried voids.

12. The apparatus of claim 11, wherein the processor is configured to control the electron source to perform a plurality of scans with the high energy charged particle beam upon the selected location on the semiconductor device die using a different charged particle beam energy for each scan.

13. The apparatus of claim 12, wherein the processor is configured to determine a depth of detected buried voids in the metal line based at least in part on an energy of the high energy charged particle beam impinging on the selected location on the semiconductor device die.

14. The apparatus of claim 11, wherein the processor is configured to control the electron source to generate a first electron beam having a first energy and a second electron beam having a second energy greater than the first energy,
   scan the semiconductor device die using the first electron beam and scan the semiconductor device die using the second electron beam,
   generate a backscattered electron image using the first electron beam and generate a backscattered electron image using the second electron beam, and
   wherein the processor detects a first buried void in the metal line close to a surface of the metal line using the first electron beam and detects a second buried void in the metal line deeper than the first buried void using the second electron beam.

15. The apparatus of claim 11, wherein the processor is configured to:
   determine a number of buried voids detected at the selected location on the semiconductor device die,
   determine a number of buried voids detected at other selected locations of other semiconductor device dies on a wafer, and
   create a wafer map based on the number of buried voids detected at the selected location and the number of buried voids detected at the other selected locations.

* * * * *